United States Patent
Salagaj et al.

(10) Patent No.: US 7,247,340 B2
(45) Date of Patent: Jul. 24, 2007

(54) METHOD OF MAKING A SUPERCONDUCTING CONDUCTOR

(75) Inventors: Thomas Martin Salagaj, Clifton Park, NY (US); Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 11/319,970

(22) Filed: Dec. 28, 2005

(65) Prior Publication Data

US 2007/0148329 A1    Jun. 28, 2007

(51) Int. Cl.
*B05D 5/12* (2006.01)
*H01L 39/24* (2006.01)
*H05H 1/24* (2006.01)

(52) U.S. Cl. .......................... 427/62; 427/569; 29/599; 505/430; 505/434; 505/470; 505/473; 505/730; 505/740; 204/192.24

(58) Field of Classification Search ............... 427/62, 427/569; 29/599; 505/430, 434, 470, 473, 505/730, 740; 204/192.24

See application file for complete search history.

(56) References Cited

U.S. PATENT DOCUMENTS

| 4,101,731 A | * | 7/1978 | Marancik ................. 174/125.1 |
| 2005/0014653 A1 | * | 1/2005 | Reeves et al. .............. 505/100 |
| 2005/0249869 A1 | * | 11/2005 | Selvamanickam et al. .... 427/62 |

OTHER PUBLICATIONS

J.Egly, "YBa2Cu3O7—Deposition on Metal Tape Substrates", EUCAS '99, Sitges, Spain, Sep. 13-17, 1999.

* cited by examiner

*Primary Examiner*—Brian K. Talbot
(74) *Attorney, Agent, or Firm*—Larson Newman Abel Polansky & White, LLP

(57) ABSTRACT

A method of forming a superconducting conductor is disclosed. The method provides translating a substrate tape through a deposition chamber and along a helical path, where the helical path has multiple windings of the substrate tape and each winding of the substrate tape extends along a feed path and a return path. The method further provides depositing a HTS layer overlying the substrate tape within a deposition chamber, wherein the deposition chamber houses the substrate tape along the feed path but not the return path.

20 Claims, 4 Drawing Sheets

METHOD OF MAKING A SUPERCONDUCTING CONDUCTOR

CROSS-REFERENCE TO RELATED APPLICATION(S)

BACKGROUND

1. Field of the Disclosure

The present invention is generally directed to superconducting conductors. The invention is particularly related to a method of forming superconducting conductors in the form of coated conductors and devices incorporating the same.

2. Description of the Related Art

Superconductor materials have long been known and understood by the technical community. Low-temperature (low-$T_c$) superconductors exhibiting superconducting properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconducting properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen, rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconducting layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes.

SUMMARY

According to one aspect, a method of forming a superconducting conductor includes translating a substrate tape through a deposition chamber and along a helical path, the helical path having multiple windings of the substrate tape, each winding extending along a feed path and a return path. The method further includes depositing a HTS layer overlying the substrate tape within the deposition chamber, the deposition chamber housing the substrate tape along the feed path but not the return path.

According to another aspect, a method of forming a superconducting conductor includes translating a substrate tape having a dimension ratio greater than about 100 through a deposition chamber and along a helical path comprising a feed path and a return path, the substrate tape comprising multiple windings comprising a first winding, a last winding and interior windings. The method further includes translating the substrate tape along the feed path having a feed translation direction $D_f$ and along the return path having a return translation direction Dr, wherein at least the interior windings extend along the feed path in a rectilinear manner between a feed guide and a take up guide. Further, the method includes directing the substrate tape along the return path to shift a distance $D_s$ in a direction perpendicular to $D_f$. In addition, the method calls for depositing a HTS layer overlying the substrate tape within the deposition chamber, the deposition chamber housing the substrate tape along the feed path but not the return path.

DESCRIPTION OF THE PREFERRED EMBODIMENT(S)

According to one aspect of the present disclosure, a method of forming a superconducting conductor is provided.

The method includes translating a substrate tape through a deposition chamber and along a helical path, the helical path having multiple windings of the substrate tape, each winding having a feed path and a return path. The method further includes depositing a HTS layer overlying the substrate tape within a deposition chamber, the deposition chamber housing the substrate tape along the feed path but not the return path.

Figure 1:
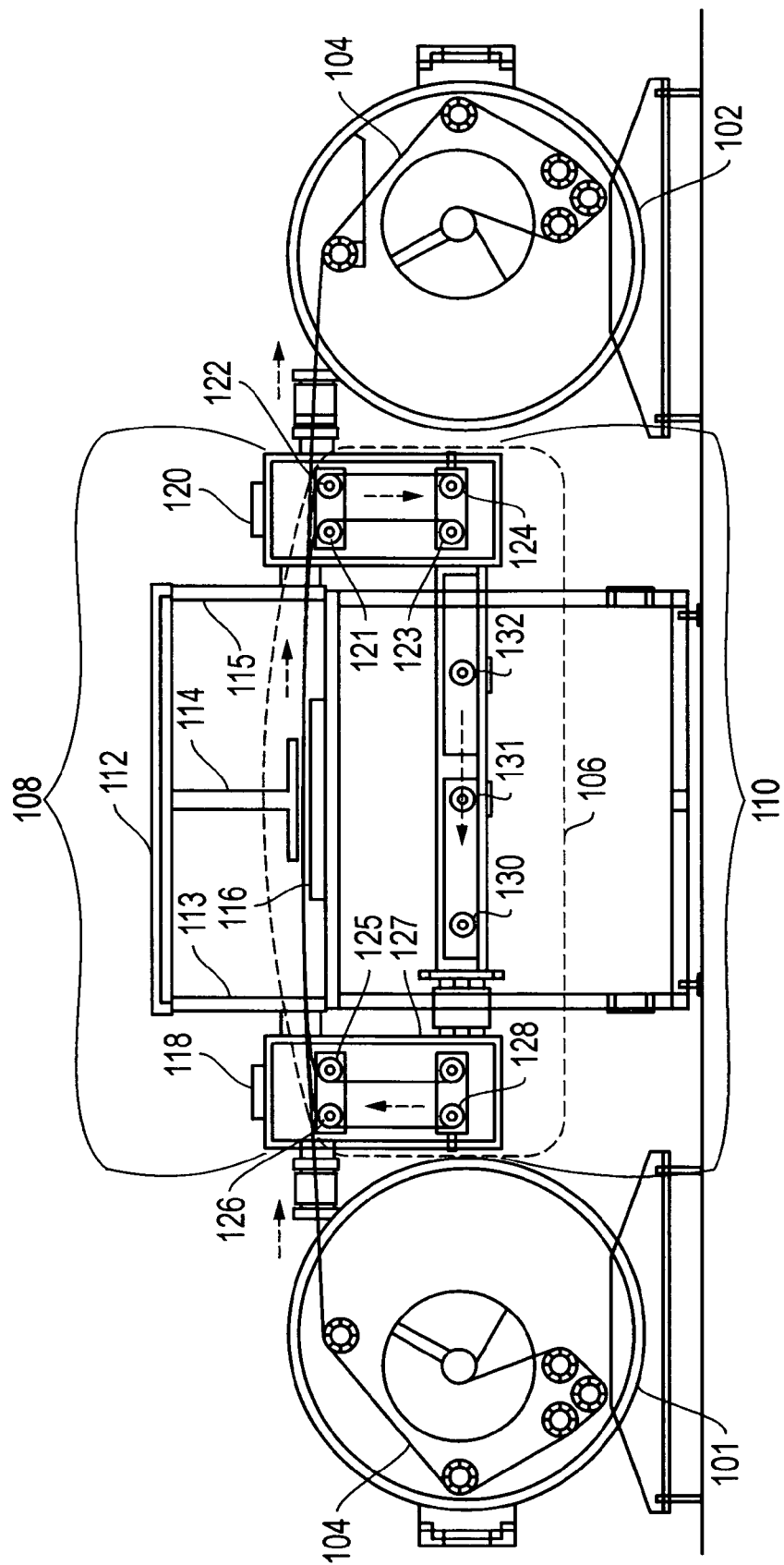
FIG. 1 illustrates a reel-to-reel system for forming a superconducting conductor according to one embodiment.

FIG. 1 illustrates a reel-to-reel system 100 including a feed reel 101 and a take-up reel 102 and a substrate tape 104 translating between the reels. According to one embodiment, the substrate tape 104 is translated from the feed reel 101 into a deposition chamber 112 and upon exiting the deposition chamber 112, the substrate tape 104 is gathered on the take-up reel 102. Each of the reels are external to the deposition chamber 112 and coupleable to the reel-to-reel system 100 such that the feed reel 101 and the take-up reel 102 can be removed after processing the substrate tape 104 in the deposition chamber 112.

Figure 2:
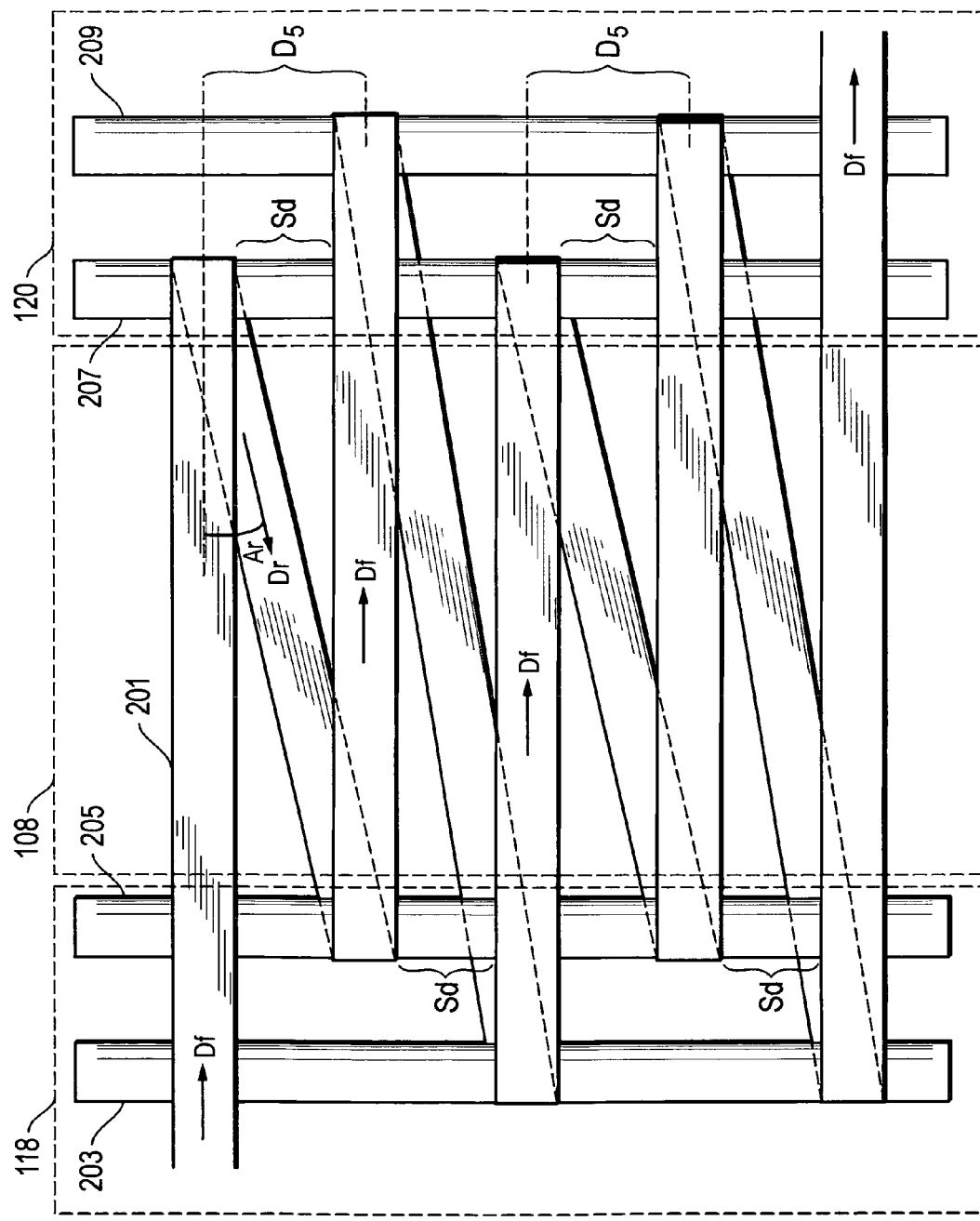
FIG. 2 illustrates a top-down perspective view of the windings of the substrate tape according to one embodiment.

Referring to the helical path of the substrate tape 104, as mentioned above the substrate tape 104 has multiple windings and according to a particular embodiment, the multiple windings includes a first winding, a last winding, and interior windings, each winding forming a full turn (i.e., 360° loop). According to one embodiment, the windings extend along a feed path 108 and a return path 110. According to a particular embodiment, the windings in the feed path 108 extend between a feed guide and a take up guide. As illustrated in FIG. 2, there may be a plurality of guides, for example, a set of feed guides including an inboard feed guide 125 and an outboard feed guide 126, as well as a set of take-up guides including an inboard take-up guide 121 and an outboard take-up guide 122. The set of inboard and outboard guides facilitate translating multiple windings and maintaining precise processing tolerances suitable for forming a superconducting conductor. Notably, the inboard and outboard guides facilitate control of the spacing distance between the windings, which facilitates rapid processing. In the embodiment illustrated, the feed path 108 is defined by and extends between opposing feed and take-up guides. The deposition chamber 112 has opposing lateral walls 113 and 115 through which the substrate tape 104 enters and exits the deposition chamber 112. The deposition zone, in which depositing species are present, is limited to that area defined between the opposing lateral walls 113 and 1 5 and does not include the opposing feed and take-up guides.

According to one embodiment, the guides are rollers over which the tape translates. According to a particular embodiment, the guides have channels for engaging the windings. Moreover, the rollers may be drive-assisted to maintain a particular tape velocity and tension throughout the process. As such, the guides maintain tension on the substrate tape and provide precision translation of the windings for rapid processing. According to one embodiment, feed guides 125 and 126 and take-up guides 121 and 122 are housed outside of the deposition chamber 112. Removal of the guides from the deposition chamber 112 may assist in maintaining precise translation tolerances required for efficient processing. According to a particular embodiment, feed guides 125 and 126 and take-up guides 121 and 122 are housed in chambers 118 and 120, respectively to provide additional separation from the reactive processing environment and to provide access to the guides for maintenance without the need to disrupt adjacent processing chambers.

Referring to the deposition process, according to one embodiment, the deposition chamber 112 is positioned within the feed path such that it houses a portion of the windings along the feed path 108 but not in the return path 110. According to a particular embodiment, the deposition chamber 112 is positioned within the feed path 108 such that the windings enter and exit the deposition chamber 112 while along only the feed path 108. Therefore, only the portions of the windings within the deposition chamber 112 are subject to deposition. Housing portions of the windings in the deposition chamber 112 facilitates the precise translation of the windings outside of the deposition chamber, and provides an environment outside of the deposition chamber 112 that is conducive to monitoring, characterizing and analyzing the quality of the product.

Perhaps even more importantly, isolation of the substrate tape to only a well-defined, limited area of windings (i.e., the feed path 108) to deposition, prevents depositing species from depositing on the substrate tape under non-optimal localized conditions resulting in a poor quality HTS layer. For example, the present inventors have found that a large deposition area, for example housing the entire helix, results in a HTS deposition along portions of the return path (e.g., the local areas of the guides), and form a 'dirty' tape having regions of HTS material of poor quality or having limited, if any, superconducting properties. The foregoing is particularly the case in the context of CVD HTS deposition, such as MOCVD, which are dispersive processes in which the deposited material is dispersed and may adhere to a variety of surfaces inside the deposition chamber, which is in direct contrast to line-of-sight deposition processes. In such cases, the position of the deposition chamber 112 only in the feed path 108 helps to contain the dispersion of the reactive material.

In further reference to the deposition process, the substrate tape 104 is translated through the deposition chamber 112, which comprises a heater 116 and a delivery structure 114 for delivering the deposited material to the surface of the windings. According to one embodiment, the windings translate through the deposition chamber 112 in a substantially rectilinear path, such that the deposition surface of the multiple windings are substantially flat and co-planar in a plane substantially normal to the delivery structure 114 for uniform deposition. Providing a substantially rectilinear path and co-planar arrangement of the portions of windings traveling through the deposition chamber 112 may facilitate control of the distance between the surface of the windings and the delivery structure 114, as well as control of the rate and uniformity of deposition on the surface of the windings, and therefore the thickness of the layer deposited. It is noted, however, that the windings of the substrate tape along the feed path may have a slight arcing contour, such as by contact with the heater or a substrate block (guide). However, such a trajectory is considered w/i the scope of generally or substantially flat and co-planar as noted above, as well as generally or substantially rectilinear. The distance between the surface of the windings and the delivery structure 114 is generally less than about 100 mm, such as less than about 75 mm, and particularly within a range of about 10 mm to about 75 mm.

In further reference to the deposition procedure, according to a particular embodiment, the deposition process is a MOCVD process that utilizes metal-organic precursors that may have a high vapor pressure at low vaporization temperatures, low decomposition temperatures, large "windows" between vaporization and decomposition temperatures, minimal contamination from organic constituents of the precursors, stability under ambient conditions, and non-toxicity. One example of a suitable precursor material includes tetramethyl heptanedionates.

A liquid precursor may be used to achieve a HTS fabricated by MOCVD. Suitable precursors include tetramethyl heptanedionate compounds of yttrium (or other rare earth such as Sm, Nd, Yb, Eu, Gd, Dy, Ho, Er), barium and copper. The Ba compound is preferably adducted with a compound such as phenanthroline to assure long-term stability. The compounds may be individually dissolved in solvents such as tetrahydrofuran (THF) and isopropanol. Both THF and isopropanol may be used to dissolve the Y and Ba compounds, and THF alone can be used to dissolve the Cu compound. When the precursors have dissolved, the individual solutions are mixed together. The liquid precursor solution is then pumped into a vaporizer using a low-flow rate, high-pressure pump such as a HPLC (High Pressure Liquid Chromatography) pump.

The solution of mixed precursors is generally heated in the vaporizer to a temperature not greater than about 500° C., such as not greater than about 400° C., or about 300° C. Particularly, the temperature is in the range between about 180° C. to about 300° C. and more particularly, from about 210° C. to about 270° C. The pressure in the vaporizer is typically less than about 30 Torr, such as less than about 20 Torr, and particularly within a range of from about 1 Torr to about 15 Torr.

The vaporized precursors and oxygen are dispersed into the deposition chamber 112 by means of the delivery structure 114, such as a showerhead. For example, a showerhead in the form of a disc with small perforations is a suitable way to achieve a uniform flow of the vaporized precursor and provide uniform deposition on the surface of the windings. The showerhead is preferably constructed with numerous fine openings, the total cross sectional area of the openings is typically less than the cross sectional area of the precursor delivery tubing.

The temperature of the vaporized precursors is maintained at an appropriate temperature as it passes through the delivery system 114 by means of a heater. Optionally, a cooling element may be employed for additional control of temperature inside of the deposition chamber 112, and particularly in the delivery structure 114. Additionally, a pressure of not greater than about 10 Torr is maintained within the deposition chamber 112, such as not greater than about 5 Torr, or a pressure of between about 1 to about 10 Torr, such as 1 to about 5 Torr. The low pressure in the presence of high gas flow rates is preferably achieved using a blower-vacuum pump system. The temperature of the substrate passing along the heater is generally maintained at a temperature not less than about 500° C., such as not less than about 600° C., or in a range of about 700 to about 900° C.

Referring again to the helical path of the windings through the reel-to-reel system 100, FIG. 1 also illustrates windings extending along the return path 110. According to one embodiment, the windings extend along a return path 110 between the set of take-up guides housed within chamber 120 and the set of feed guides housed within chamber 118. As discussed previously, the set of take-up guides includes an inboard take-up guide 121 and an outboard take-up guide 122, and the set of feed guides includes an inboard feed guide 125 and an outboard feed guide 126. According to the illustrated embodiment of FIG. 1, the return path 10 further includes a set of feed orientation guides housed within chamber 120 and a set of take-up orientation guides housed within chamber 118. As with previously discussed guides, sets of guides may be employed, for example, the set of feed orientation guides includes an inboard feed orientation guide 123 and an outboard feed orientation guide 124, and the set of take-up orientation guides includes an inboard take-up orientation guide 127 and an outboard take-up orientation guide 128.

In reference to the return path 110, according to one embodiment, the tension on the windings extending along the return path 110 is monitored. Excess tension on the windings may result in damage to the deposited layer through stretching or excess torsion on the tape at certain points. Alternatively, too little tension on the tape during processing may result in loss of control and efficiency of processing. As such, it is desirable to maintain and control the tension of the tape for rapid and efficient processing. According to one embodiment, the tension of the windings is monitored by feed reel and take-up reels 101 and 102.

According to another embodiment, processing of the windings along the return path 110 includes characterizing the windings along the return path 110. Characterizing the substrate tape and constituent layers along the return path 110 affords quality control during processing of the deposited layer and real-time processing adjustments to facilitate the manufacture of quality superconducting conductors. Additionally, the separation of the deposition chamber 112 to only the feed path 108 facilitates characterization equipment in the return path 110 without concern of degrading the characterization equipment due to exposure to the reactive environment of the deposition chamber 112. According to a particular embodiment, characterizing the windings along the return path includes video monitoring of the deposited HTS layer. Additionally, characterizing can employ equipment utilizing X-ray analysis, electromagnetic analysis, as well as optical analysis, or the like. According to one embodiment, characterizing the windings along the return path 110 can include electromagnetic characterization, for example, measuring the angular dependence of the critical current. In another embodiment, characterizing the windings along the return path 110 includes characterizing physical dimensions of the tape, for example the total width of the tape, or the total thickness of the tape, or the thickness of one layer, such as the deposited HTS layer.

For a fuller understanding of the translation of the windings in the helical path, FIG. 2 illustrates a top-down perspective of the windings according to one embodiment. According to one embodiment, the direction of the windings extending along the feed path is designated $D_f$. As previously discussed, the reel-to-reel system may comprise a set of feed guides including an outboard feed guide 203 and an inboard feed guide 205, and a set of take-up guides including an inboard take-up guide 207 and an outboard take-up guide 209. The orientation guides that were previously illustrated in FIG. 1 are not visible in the top down view (see FIG. 3). Notably, the translation direction of the windings along the feed path 110 is designated by $D_f$ and is substantially rectilinear, thus the windings are not twisted or shifted as the winding travels over guides 203, 205, 207 and/or 209. This provides a flat surface for deposition of the HTS layer along the deposition zone of the feed path 108.

The portions of the windings above the guides along the feed path are spaced apart by a spacing distance designated by Sd. For the purposes of this disclosure, the spacing distance, Sd is defined as the distance between the edges of two adjacent windings, as illustrated in FIG. 2. According to one embodiment, the spacing distance is not greater than about 10 cm, such as not greater than about 5 cm, or even not greater than about 2 cm. Still, the spacing may be less, such as not greater than about 1 cm, about 8 mm, or even not greater than about 5 mm. A certain embodiment has a spacing of about 0.25 to 2.0 mm, such as about 1.0 mm.

In further reference to FIG. 2, the portions of the windings above the guides extending within the feed path are shifted by a distance $D_s$. For the purposes of this disclosure, the distance shifted $D_s$ between each winding is measured as the distance between the center of one winding to the center of an adjacent winding in the feed path 108, along a direction perpendicular to the feed path translation direction $D_f$. According to one embodiment, the distance shifted between windings is not greater than about 15 cm, such as not greater than about 10 cm, about 5 cm, or even 2 cm. In a particular embodiment, the distance shifted between windings is less, such as not greater than about 10 mm, or about 8 mm, or even not greater than about 5 mm.

The windings traveling under the guides and extending along the return path are translated in a return direction $D_r$. The return direction $D_r$, translates the tape back towards the feed guides and orients the winding for translation along the feed path, such that subsequent windings do not overlap a previous winding. As such, the portion of the winding in the return path is angled at a return angle $A_r$, which is a measure of the angle between the feed translation direction $D_f$ and the return translation direction, as illustrated in FIG. 2. While it is desirable to shift the tape such that subsequent windings do not cover the previous winding and can be co-planar along the feed path, excess shifting of the windings stresses the substrate and constituent layers thereby potentially causing damage to the material and degrading the quality of the superconducting conductor. As such, the return angle is minimized to reduce stress in the windings. According to one embodiment, the return angle is not greater than about 10°, such as about 8.0°, or about 6.0°, or even not greater than about 5.0°. Still, the return angle may be less, such as about 3.0°, or even 2.0°. According to a particular embodiment, shifting the winding along the return path includes changing the direction of the winding without by twisting the tape about its longitudinal axis rather than stretching the tape. It will be appreciated that the return angle may be different for each winding depending upon the length of the winding along the return path and the desired spacing between particular windings, although generally the return angle is the same for all windings.

Referring to FIG. 2, four windings are illustrated, but more or fewer windings may be formed depending upon the size of the deposition chamber, the width of the tape, the capabilities of the processing machinery, and the physical properties of the tape and constituent layers. Additionally, FIG. 2 illustrates that the windings are alternated between the outboard and inboard set of feed guides and take-up guides. For example, the first winding is translated between the inboard feed guide 205 and the inboard take-up guide 207, while the next winding is translated along the feed path to the outboard take-up guide 203, along the return path, to the outboard feed guide 209. A fuller perspective of the alternating windings is provided in FIG. 3.

Figure 3:
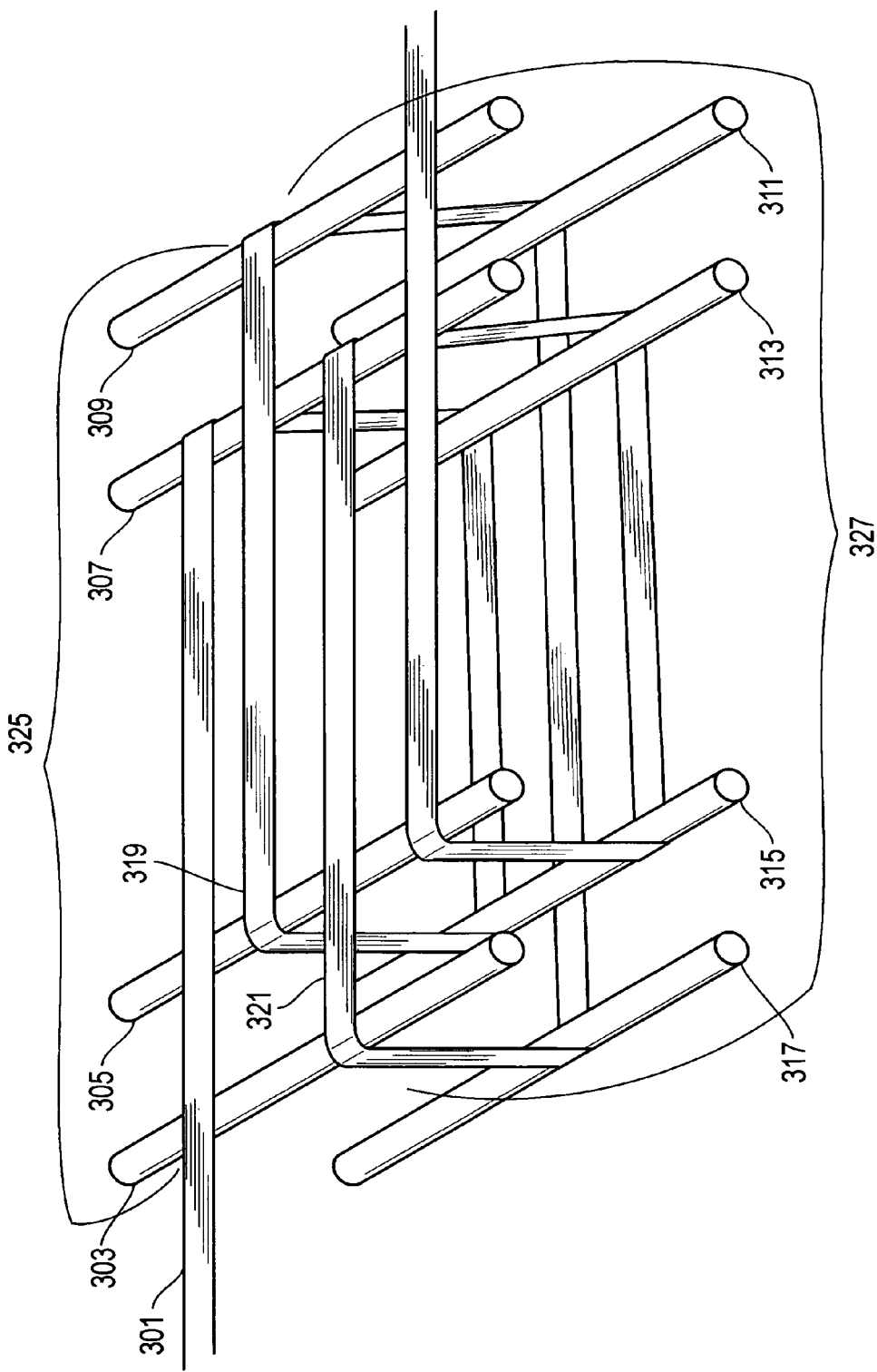
FIG. 3 illustrates a perspective view of the windings of the substrate tape according to one embodiment.

Referring to FIG. 3, a perspective view of a plurality of windings along the feed path 325 and the return path 327 is illustrated according to one embodiment. According to the illustrated embodiment, a first winding 319 is the portion of the substrate tape 301 that is translated along the inboard feed guide 305, into the feed path 325 to the inboard take-up guide 307, into the return path 327 and below to the inboard feed orientation guide 313, to the inboard take-up orientation guide 315 and returning to the inboard feed guide 305. Accordingly, a second winding 321 is the portion of the substrate tape 301 that is translated over the inboard feed guide 305, into the feed path 325 to the outboard take-up guide 309, into the return path 327 and below to the outboard feed orientation guide 311, across to the outboard take-up orientation guide 317, to the outboard feed guide 303, and into the feed path 325 and across to the inboard feed guide 305. Each winding generally makes a full (360°) loop.

Figure 4:
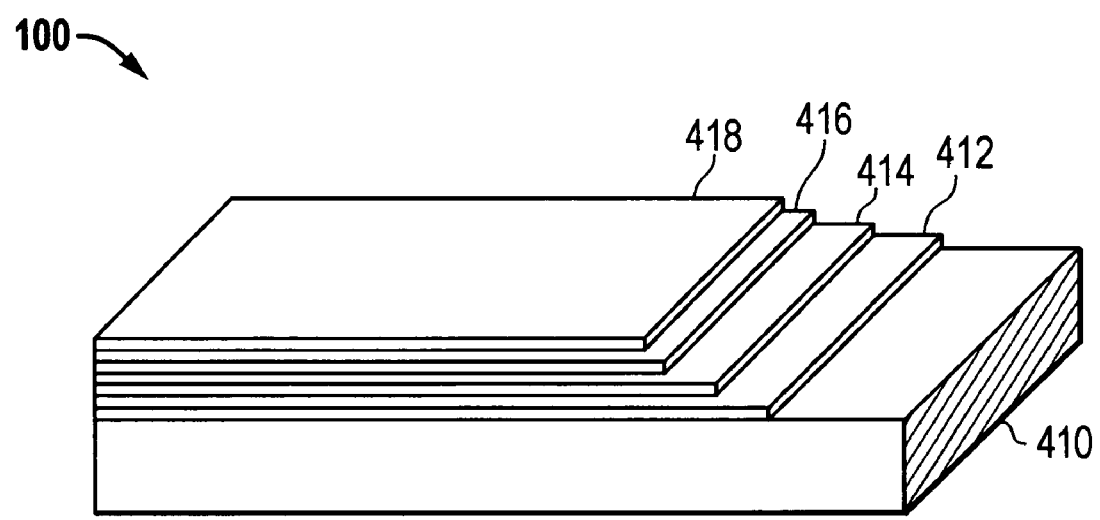
FIG. 4 illustrates a perspective view of the layers of the superconducting conductor according to one embodiment.

For further clarity, FIG. 4 is provided to illustrate a perspective view of a layered superconducting conductor according to one embodiment. The superconducting conductor includes a substrate 410, a buffer layer 412, and a superconducting layer 414. An optional capping layer 416 may be provided overlying the superconducting layer, followed by a stabilizer layer 418 overlying the capping layer 416.

The substrate 410 is generally formed of a material able to withstand the mechanical stress and strain of reel-to-reel processing and may also provide mechanical integrity for the final superconducting conductor in a variety of applications. Further, the substrate 410 may withstand high processing temperatures and aggressive processing environments (e.g., highly oxidative) that are utilized during fabrication of the superconducting conductor. In view of the foregoing, the substrate 410 is generally metal-based, and typically, an alloy of at least two metallic elements. Suitable substrate materials include nickel-based metal alloys such as the known Inconel® group of alloys. Of available materials, nickel-based metal alloys such as the Inconel® group of alloys tend to have desirable creep, chemical and mechanical properties, including coefficient of expansion, tensile strength, yield strength, and elongation.

Further, the substrate 410 may be resistive to enable reduction in eddy current losses in the superconducting layer. Such reduction in eddy current losses is particularly beneficial when the article takes the form of a rotating machine, such as a power generator or motor (further described below). Use of resistive substrates minimizes AC losses when deployed in the form of a rotating machine. Typical resistivities of the substrate are generally greater than about 50 micro-ohm cm, such as greater than about 100 micro-ohm cm.

The substrate 410 generally is a tape, having a high dimension ratio. As used herein, the term 'dimension ratio' is used to denote the ratio of the length of the substrate 410 or tape to the next longest dimension, the width of the substrate 410 or tape. For example, the width of the substrate 410 ranges approximately from 0.4–10 cm and the length of the substrate 410 is typically greater than about 100 m, oftentimes greater than about 500 m. Indeed, one embodiment provides for superconducting substrates having a length on the order of 1 km or above, which may comprise multiple tape segments. Accordingly, the substrate may have a dimension ratio that is fairly high, on the order of not less than 10, not less than about 100, or even not less than about $10_3$. Certain embodiments are longer, having a dimension ratio of $10_4$ and higher. Additionally, reference is made herein to the major plane of the substrate 410, which is defined by the plane of the tape, which includes the length and width direction, that is, the surface of the substrate on which the majority of films or layers are deposited.

Further, the thickness of the substrate 410 may be reduced while still providing adequate strength to withstand reel-to-reel processing, handling, and integrity in the field. Typically, the substrate 410 has a thickness not greater than about 50 microns, or even not greater than 40 microns. Still, the thickness of the substrate 410 may be not greater than about 30 microns or even as thin as about 20 microns or less.

Moreover, the substrate 410 may be treated so as to have desirable surface properties for subsequent deposition of the constituent layers of the superconducting conductor. For example, the surface may be lightly polished to a desired flatness and surface roughness. Additionally, the substrate 410 may be treated to be biaxially textured as is understood in the art, such as by the known RABiTS (roll assisted biaxially textured substrate) technique, although generally embodiments herein take advantage of non-textured substrates, particularly including metal alloy polycrystalline substrates.

Referring again to FIG. 4, the illustrated embodiment provides a buffer layer 412. The buffer layer may be a single layer, or more commonly, be made up of several films. According to one embodiment, the buffer layer 412 includes a biaxially textured film, having a crystalline texture that is generally aligned along crystal axes both in-plane and out-of-plane of the film. The biaxial texturing of the buffer layer 412 may be accomplished by IBAD. As is understood in the art, IBAD is acronym that stands for ion beam assisted deposition, a technique that may be advantageously utilized to form a suitably textured buffer layer for subsequent formation of a superconducting layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference.

The buffer layer 412 may include additional films, such as a barrier film provided between an IBAD film and the substrate 410. In this regard, the barrier film 412 may advantageously be formed of an oxide, such as yttria, and functions to isolate the substrate from the IBAD film. A barrier film 412 may also be formed of non-oxides such as silicon nitride. Suitable techniques for deposition of a barrier film include chemical vapor deposition and physical vapor deposition including sputtering. Typical thicknesses of the barrier film 412 may be within a range of about 100–200 Angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconducting layer may exist. Accordingly, the buffer layer 412 may further include another buffer film, this one in particular implemented to reduce a mismatch in lattice constants between the superconducting layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques, and generally retains the biaxial texture of the underlying layer on which it is formed.

The superconducting layer 414 is generally in the form of a high-temperature superconductor (HTS) layer. HTS materials are typically chosen from any of the high-temperature superconducting materials that exhibit superconducting properties above the temperature of liquid nitrogen, 77 K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconducting layer 414 may be formed by any one of various techniques, including thick and thin film forming techniques. Preferably, a thin film physical vapor deposition technique such as pulsed laser deposition (PLD) can be used for a high deposition rates. However, chemical vapor deposition, such as MOCVD is generally used according to embodiments herein. Typically, the superconducting layer has a thickness on the order of about 1 to about 30 microns, most typically about 2 to about 20 microns, such as about 2 to about 10 microns, in order to get desirable amperage ratings associated with the superconducting layer 414.

The stabilizer layer 418 and capping layer 416 (optional) are generally implemented to provide a low resistance interface for electrical stabilization to aid in prevention of superconductor burnout in practical use. More particularly, stabilizer layer 418 aids in continued flow of electrical current along the superconducting conductor in cases where cooling fails or the critical current density is exceeded, and the superconducting layer becomes non-superconducting. The capping layer 416 may be incorporated in the structure particularly for those embodiments where undesirable interaction between the superconducting layer 414 and the stabilizer layer 418 would otherwise take place. In such cases, the capping layer may be formed of a noble metal, such as gold, silver, platinum, and palladium. Silver is typically used due to its cost and general accessibility. The capping layer 416 is typically made to be thick enough to prevent unwanted diffusion of the components from the stabilizer layer 418 into the superconducting layer 414, but is made to be generally thin for cost reasons (raw material and processing costs). Typical thicknesses of the capping layer 416 range within about 0.1 to about 10.0 microns, such as 0.5 to about 5.0 microns. Various techniques may be used for deposition of the capping layer 416, including physical vapor deposition, such as DC magnetron sputtering.

The stabilizer layer 418 is generally incorporated to overlie the superconducting layer 414, and in particular, overlie and directly contact the capping layer 416 in the particular embodiment shown in FIG. 1, although elimination of the capping layer would result in direct contact with the superconducting layer 414 according to an alternate embodiment. The stabilizer layer 418 functions as a protection/shunt layer to enhance stability against harsh environmental conditions and superconductivity quench. The layer is generally thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating.

While particular aspects of the present invention have been described herein with particularity, it is well understood that those of ordinary skill in the art may make modifications hereto yet still be within the scope of the present claims. The previously mentioned embodiments and examples, in no way limit the scope of the following claims.

What is claimed is:

1. A method of forming a superconducting conductor comprising:
    translating a substrate tape through a deposition chamber and along a helical path, the helical path having multiple windings of the substrate tape, each winding extending along a feed path and a return path, the deposition chamber including a first lateral wall and a second lateral wall defining therebetween a deposition zone; and depositing a HTS layer overlying the substrate tape within the deposition zone of the deposition chamber, the substrate tape exiting the deposition chamber through the second lateral wall such that the deposition chamber houses the substrate tape along the feed path but not the return path.

2. The method of claim 1, wherein the substrate tape has an dimension ratio not less than about 100.

3. The method of claim 1, further comprising feeding the substrate tape into the deposition chamber from a feed reel and taking up the substrate tape exiting from the deposition chamber with a take-up reel, wherein the feed reel and take-up reel are external to the deposition chamber.

4. The method of claim 1, wherein the deposition chamber comprises a heater.

5. The method of claim 1, wherein the multiple windings of the substrate tape comprises a first winding, a last winding, and interior windings, the feed path of at least the interior windings extending between a feed guide and a take-up guide.

6. The method of claim 5, wherein the feed path is rectilinear.

7. The method of claim 1, wherein the multiple windings of the substrate tape are spaced apart by spacing distance $S_d$, the substrate tape translates along the feed path along a feed translation direction $D_f$ and along the return path along a return translation direction $D_r$, and $D_f$ is non-parallel to $D_r$ to shift the substrate tape a distance $D_s$, in a direction perpendicular to $D_f$.

8. The method of claim 7, wherein the return translation direction $D_r$ extends along an angle of not greater than about 10.0° relative to the feed translation direction $D_f$.

9. The method of claim 1, further comprising characterizing the substrate tape as the substrate tape translates through the return path.

10. The method of claim 9, wherein characterizing comprises video monitoring of the HITS layer.

11. The method of claim 1, wherein depositing the HTS layer comprises depositing the HTS layer via chemical vapor deposition.

12. The method of claim 11, wherein chemical vapor deposition is metal organic chemical vapor deposition (MOCVD).

13. The method of claim 1, wherein the windings of the substrate tape along the feed path are substantially parallel to each other and are co-planar.

14. The method of claim 13, wherein the plurality of windings in the feed path are spaced apart by a spacing distance $S_d$, wherein $S_d$ is not greater than about 10 mm.

15. The method of claim 1, further comprising heating the substrate tape within the deposition chamber to a temperature not less than about 500° C.

16. The method of claim 1, wherein the method further comprises depositing a biaxially textured buffer layer to overlie the substrate, prior to deposition of the HTS layer.

17. The method of claim 16, wherein depositing the buffer layer comprises depositing a buffer layer via ion beam assisted deposition (IBAD).

18. The method of claim 1, wherein the method further comprises depositing a stabilizer layer overlying the HTS layer, the stabilizer layer comprising a conductive metal.

19. A method of forming a superconducting conductor comprising:

translating a substrate tape having a dimension ratio greater than about 100 through a deposition chamber and along a helical path comprising a feed path and a return path, the substrate tape comprising multiple windings comprising a first winding, a last winding and interior windings, the deposition chamber including a first lateral wall and a second lateral wall defining therebetween a deposition zone;

translating the substrate tape along the feed path having a feed translation direction $D_f$ and along the return path having a return translation direction $D_r$ wherein at least the interior windings extend along the feed path in a rectilinear manner between a feed guide and a take up guide;

directing the substrate tape along the return path to shift a distance $D_s$ in a direction perpendicular to $D_f$, and depositing a HTS layer overlying the substrate tape within the deposition zone of the deposition chamber, the substrate tape exiting the deposition chamber through the second lateral wall such that the deposition chamber houses the substrate tape along the feed path but not the return path.

20. A method of forming a superconducting conductor comprising:

feeding a substrate tape having a dimension ratio not greater than about 100 into a deposition chamber from a feed reel and taking up the substrate tape exiting from the deposition chamber with a take-up reel wherein the feed reel and take-up reel are external to the deposition chamber, the substrate tape including a substrate and a biaxially textured buffer layer overlying the substrate, the deposition chamber including a first lateral wall and a second lateral wall defining therebetween a deposition zone;

translating the substrate tape along a helical path comprising a feed path and a return path, the substrate tape comprising multiple windings having a first winding, a last winding and interior windings, wherein the substrate tape translates along the feed path having a feed translation direction $D_f$ and along the return path having a return translation direction $D_r$, at least the interior windings extending along the feed path in a rectilinear manner between a feed guide and a take up guide;

directing the substrate tape along the return path to shift a distance $D_s$ in a direction perpendicular to the feed translation direction $D_f$, the return translation direction $D_r$ extending along an angle not greater than about 10.0° relative to the feed translation direction $D_f$; and depositing a HTS layer to overlie the biaxially textured buffer layer within the deposition zone of the deposition chamber, the substrate tape exiting the deposition chamber through the second lateral wall such that the deposition chamber houses the substrate tape along the feed path but not the return path.

* * * * *

UNITED STATES PATENT AND TRADEMARK OFFICE
CERTIFICATE OF CORRECTION

PATENT NO. : 7,247,340 B2 Page 1 of 1
APPLICATION NO. : 11/319970
DATED : July 24, 2007
INVENTOR(S) : Thomas Martin Salagaj et al.

It is certified that error appears in the above-identified patent and that said Letters Patent is hereby corrected as shown below:

Col. 11, Line 41, Claim 10 "HITS layer." should be --HTS layer--.

Signed and Sealed this

Fourth Day of December, 2007

JON W. DUDAS
*Director of the United States Patent and Trademark Office*